(12) United States Patent
Chiu et al.

(10) Patent No.: US 11,652,020 B2
(45) Date of Patent: May 16, 2023

(54) THERMAL SOLUTIONS FOR MULTI-PACKAGE ASSEMBLIES AND METHODS FOR FABRICATING THE SAME

(71) Applicant: Intel Corporation, Santa Clara, CA (US)

(72) Inventors: Chia-Pin Chiu, Tempe, AZ (US); Robert Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 640 days.

(21) Appl. No.: 16/425,264

(22) Filed: May 29, 2019

(65) Prior Publication Data

US 2020/0381330 A1 Dec. 3, 2020

(51) Int. Cl.
| | |
|---|---|
| *H05K 1/18* | (2006.01) |
| *H01L 23/367* | (2006.01) |
| *H01L 23/00* | (2006.01) |
| *H01L 23/42* | (2006.01) |
| *H01L 25/10* | (2006.01) |
| *H01L 23/498* | (2006.01) |
| *H01L 21/48* | (2006.01) |
| *H05K 1/14* | (2006.01) |
| *H01L 25/00* | (2006.01) |

(52) U.S. Cl.
CPC ...... *H01L 23/3675* (2013.01); *H01L 21/4882* (2013.01); *H01L 23/42* (2013.01); *H01L 23/49838* (2013.01); *H01L 24/16* (2013.01); *H01L 25/105* (2013.01); *H01L 25/50* (2013.01); *H05K 1/144* (2013.01); *H05K 1/181* (2013.01); *H01L 2224/16227* (2013.01); *H05K 2201/042* (2013.01); *H05K 2201/10378* (2013.01); *H05K 2201/10424* (2013.01)

(58) Field of Classification Search
CPC .... H05K 1/14; H05K 1/141–144; H05K 1/18; H05K 1/181–187; H05K 2201/042; H05K 2201/10378; H05K 2201/10424; H05K 21/4482
USPC .............. 361/690–710, 770–790, 803; 257/660–707
See application file for complete search history.

(56) References Cited

U.S. PATENT DOCUMENTS

| | | | | |
|---|---|---|---|---|
| 5,211,656 | A | * | 5/1993 | Maddocks ............. A61J 17/113 606/236 |
| 5,335,146 | A | * | 8/1994 | Stucke ..................... H05K 1/14 361/744 |
| 6,297,957 | B1 | * | 10/2001 | Johnson .................... G06F 1/20 361/679.48 |
| 6,297,960 | B1 | * | 10/2001 | Moden ................ H01L 23/3675 257/E25.023 |

(Continued)

*Primary Examiner* — Tuan T Dinh
(74) *Attorney, Agent, or Firm* — Essential Patents Group, LLP.

(57) ABSTRACT

Integrated circuit assemblies, electronic systems, and methods for fabricating the same are disclosed. An integrated circuit assembly is formed by thermally contacting at least two integrated circuit packages to opposite sides of a shared heat dissipation device. In one embodiment, the at least two integrated circuit packages are electrically attached to an electronic card to form an intermediate integrated circuit assembly. In a further embodiment, the integrated circuit assembly includes at least one intermediate integrated circuit assembly electrically attached to an electronic board.

18 Claims, 9 Drawing Sheets

(56) References Cited

U.S. PATENT DOCUMENTS

| | | | | |
|---|---|---|---|---|
| 7,280,373 B2* | 10/2007 | Aizawa | ................... | G06F 1/184 |
| | | | | 361/802 |
| 2004/0195667 A1* | 10/2004 | Karnezos | ............ | H01L 23/4334 |
| | | | | 257/E25.023 |
| 2006/0060963 A1* | 3/2006 | Chang | ................. | H01L 25/0657 |
| | | | | 257/E25.011 |
| 2008/0052462 A1* | 2/2008 | Blakely | ............... | G06F 13/1673 |
| | | | | 711/115 |
| 2009/0121326 A1* | 5/2009 | Kim | ....................... | H05K 1/141 |
| | | | | 257/E23.169 |
| 2010/0165562 A1* | 7/2010 | Segaram | ................ | H05K 1/147 |
| | | | | 361/679.31 |
| 2014/0091445 A1* | 4/2014 | Teh | ......................... | H01L 21/56 |
| | | | | 257/E21.705 |
| 2016/0148902 A1* | 5/2016 | Chen | ....................... | H01L 25/50 |
| | | | | 438/107 |
| 2020/0126890 A1* | 4/2020 | Singh | ................... | H01L 23/427 |

* cited by examiner

THERMAL SOLUTIONS FOR MULTI-PACKAGE ASSEMBLIES AND METHODS FOR FABRICATING THE SAME

TECHNICAL FIELD

Embodiments of the present description generally relate to the removal of heat from multi-package assemblies, and, more specifically, to multi-package assemblies having a thermal solution that is shared between at least two integrated circuit packages within the multi-package assemblies.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As these goals are achieved, the density of power consumption of components within integrated circuit devices forming the integrated circuit packages has increased, which, in turn, increases the average junction temperature of the integrated circuit device. If the temperature of the integrated circuit device becomes too high, circuits within the integrated circuit device may be damaged or destroyed. This is a particular problem when the integrated circuit device of the integrated circuit package has a specific area or areas that generate greater heat than other areas of the integrated circuit device during operation.

Furthermore, as multi-package assemblies become smaller, the integrated circuit packages within the assemblies are positioned closer to one another. The increased closeness of the integrated circuit packages within the multi-package assemblies and the increased power levels of the integrated circuit devices within the integrated circuit packages can give rise to problems with the removal of heat from the multi-package assemblies, as there is limited spaced to incorporate effective thermal solutions within the multi-package assemblies.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
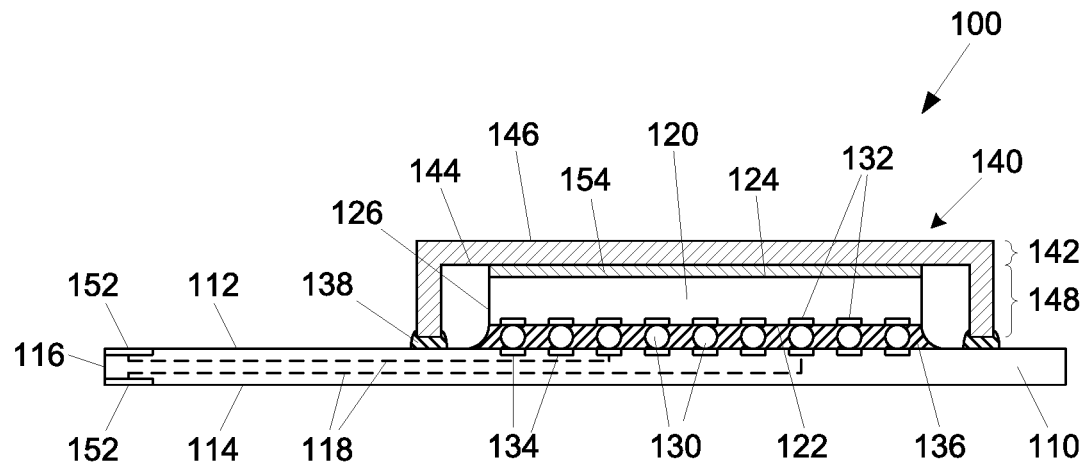
FIG. 1 is a side cross-sectional view of an integrated circuit package, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include an integrated circuit assembly comprising at least two integrated circuit packages, wherein the at least two integrated circuit packages share a heat dissipation device. In one embodiment, the at least two integrated circuit packages may be electrically attached to an electronic card to form an intermediate integrated circuit assembly. In a further embodiment, the integrated circuit assembly may comprise at least one intermediate integrated circuit assembly electrically attached to an electronic board.

As shown in FIG. 1, an integrated circuit package 100 may be formed by first providing or forming an electronic substrate 110 and attaching at least one integrated circuit device 120 to a first surface 112 of the electronic substrate 110 with a plurality of device interconnects 130. The plurality of device interconnects 130 may extend between bond pads 132 formed in or on a first surface 122 (also known as the "active surface") of the integrated circuit device 120, and substantially mirror-image bond pads 134 formed in or on the first surface 112 of the electronic substrate 110. The at least one integrated circuit device 120 may further include a second surface 124 (also known as the "back surface") opposing the first surface 122 and at least one side 126 extending between the first surface 122 and the second surface 124 of the at least one integrated circuit device 120.

The least one integrated circuit device 120 may be any appropriate electronic device, including, but not limited to, a microprocessor, a multichip package, a chipset, a graphics device, a wireless device, a memory device, an application specific integrated circuit device, combinations thereof, stacks thereof, or the like. The device interconnects 130 may be any appropriate electrically conductive material or structure, including but not limited to, solder balls, metal bumps or pillars, metal filled epoxies, or a combination thereof In one embodiment, the device interconnects 130 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device interconnects 130 may be copper bumps or pillars. In a further embodiment, the device interconnects 130 may be metal bumps or pillars coated with a solder material.

An underfill material 136, such as an epoxy material, may be disposed between the first surface 122 of the at least one integrated circuit device 120 and the first surface 112 of the electronic substrate 110, and surrounding the plurality of device interconnects 130. As will be understood to those skilled in the art, the underfill material 136 may be dispensed between the first surface 122 of the integrated circuit device 120 and the first surface 112 of the electronic substrate 110 as a viscous liquid and then hardened with a curing process. The underfill material 136 may also be a molded underfill material. The underfill material 136 may provide structural integrity and may prevent contamination, as will be understood to those skilled in the art.

As further shown in FIG. 1, the electronic substrate 110 may provide electrical communication through conductive routes 118 (illustrated as dashed lines) between the at least one integrated circuit device 120 and at least one edge connect 152, wherein the at least one edge connect 152 may be located proximate one side 116 of the electronic substrate 110 (extending between the first surface 112 and an opposing second surface 114 of the electronic substrate 110) and may be on the first surface 112 and/or the second surface 114 of the electronic substrate 110. These conductive routes 118 may be referred to herein as "metallization". As will be understood to those skilled in the art, the bond pads 132 of the integrated circuit device 120 may be in electrical communication with integrated circuitry (not shown) within the integrated circuit device 120.

The electronic substrate 110 may comprise a plurality of dielectric material layers (not shown in FIG. 1), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, as well as laminates or multiple layers thereof, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The conductive routes 118 may be a combination of conductive traces (not shown) and conductive vias (not shown) that extend through the plurality of dielectric material layers (not shown). These conductive traces and conductive vias, and processes of forming the same, are well known in the art and are not shown in FIG. 1 for purposes of clarity. The conductive traces and the conductive vias may be made of any appropriate conductive material, including, but not limited to, metals, such as copper, silver, nickel, gold, and aluminum, alloys thereof, and the like. As will be understood by those skilled in the art, the electronic substrate 110 may be a cored substrate or a coreless substrate.

As shown in FIG. 1, the integrated circuit package 100 may include the at least one heat dissipation device 140 comprising a planar portion 142 having a first surface 144 and an opposing second surface 146 and with at least one footing 148 extending from the first surface 144 of the planar portion 142, wherein the at least one footing 148 may be attached to the electronic substrate 110 adjacent to the at least one integrated circuit device 120. The at least one footing 148 of the heat dissipation device 140 may be attached to the electronic substrate 110 by any appropriate means, including but not limited to an adhesive material 138, such as an epoxy.

As illustrated in FIG. 1, the heat dissipation device 140 may be a single material throughout, such as when the heat dissipation device 140 including the heat dissipation device footing 148 is formed by a single process step, including but not limited to stamping, skiving, molding, and the like. However, embodiments of the present description may also include heat dissipation device 140 made of more than one component. For example, the heat dissipation device footing 148 may be formed separately from the planar portion 142, then attached together to form the heat dissipation device 140. In various embodiments, the heat dissipation device footing 148 may be a plurality of walls, pillars, or the like, or may be a single "picture frame" structure surrounding the at least one integrated circuit device 120.

In one embodiment, the heat dissipation device 140 may be attached to the first surface 112 of the electronic substrate 110, such that the first surface 144 of the planar portion 142 of the heat dissipation device 140 spans, but does not necessarily directly contact the second surface 124 (e.g. opposing the first surface 122) of the integrated circuit device 120. In one embodiment of the present description, as shown in FIG. 1, a thermal interface material 154, such as a grease, a polymer, a thermal gap pad, or the like, may be disposed between the first surface 144 of the planar portion 142 of the heat dissipation device 140 and the second surface 124 of the integrated circuit device 120 to facilitate heat transfer therebetween.

Figure 2:
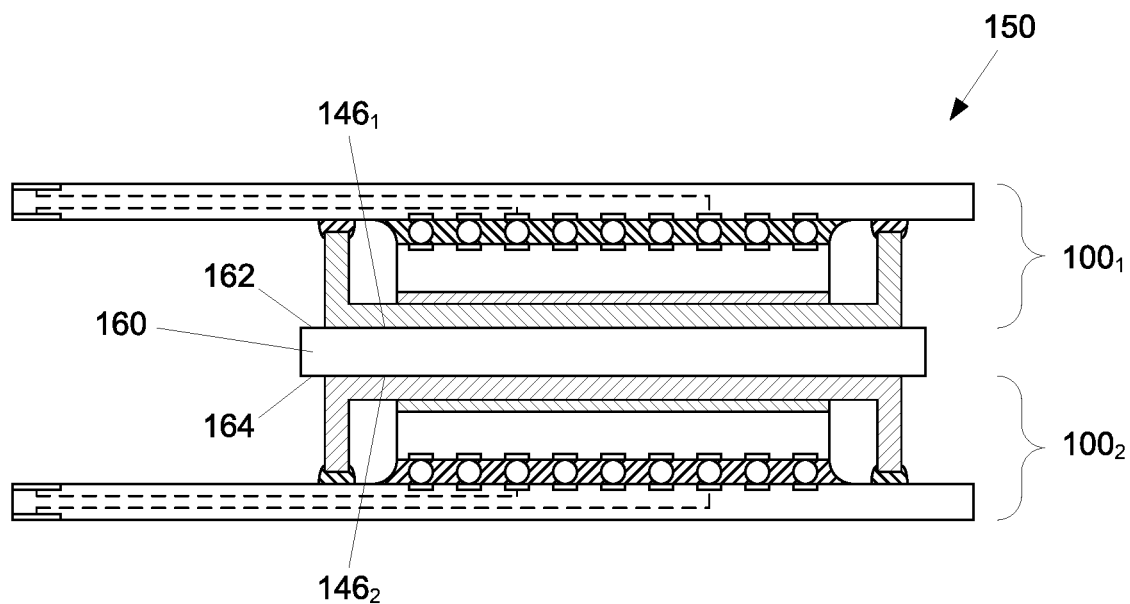
FIG. 2 is a side cross-sectional view of an intermediate integrated circuit assembly having a pair of integrated circuit packages of FIG. 1 sharing a single heat dissipation device, according to an embodiment of the present description.

As shown in FIG. 2, an intermediate integrated circuit assembly 150 may be formed by forming at least two integrated circuit packages, such as a pair of integrated circuit packages 100 of FIG. 1, which are illustrated as a first integrated circuit package $100_1$ and a second integrated circuit package $100_2$. The first integrated circuit package $100_1$ and the second integrated circuit package $100_2$ may be oriented such that a heat spreader second surface $146_1$ of the first integrated circuit package $100_1$ and a heat spreader second surface $146_2$ of the second integrated circuit package $100_2$ face one another with a heat dissipation device 160 disposed therebetween and in thermal contact therewith. In one embodiment, the heat spreader second surface $146_1$ of the first integrated circuit package $100_1$ may physically contact a first surface 162 of the heat dissipation device 160, and the heat spreader second surface $146_2$ of the second integrated circuit package $100_2$ may physically contact a second surface 164 (opposing the first surface 162) of the heat dissipation device 160.

As will be understood, since at least two integrated circuit packages share a single heat dissipation device, the heat dissipation device 160 should have the capability to quickly remove a considerable amount of heat. Thus, in one embodiment, the heat dissipation device 160 may be a liquid cooling device. A liquid cooling device may be a liquid circuit device or a heat pipe. A liquid circuit device that generally consists of a cold plate, that is in thermal contact with the integrated circuit packages, and a heat exchanger positioned away from the assembly that rejects the heat absorbed by a liquid from the integrated circuit package, wherein a pump circulates the liquid between the cold plate and the heat exchanger. It is understood that the cold plate of the heat dissipation device may comprise a fluid chamber having a plurality of fins for heat transfer, may comprise microchannels forming serpentine routes through the cold plate, or any appropriate variations thereof. A heat pipe is a pipe having a working liquid sealed therein, as will be subsequently illustrated. The liquid turns to a vapor by absorbing heat proximate two integrated circuit packages and travels to a cooler area of the heat pipe and condense by to a liquid releasing the latent heat. The liquid then returns by capillary action, centrifugal force, or gravity, and the cycle repeats. The various configurations and embodiments for liquid cooling devices are well known in the art and for purposes of brevity and conciseness will not be described or illustrated herein.

Figure 3:
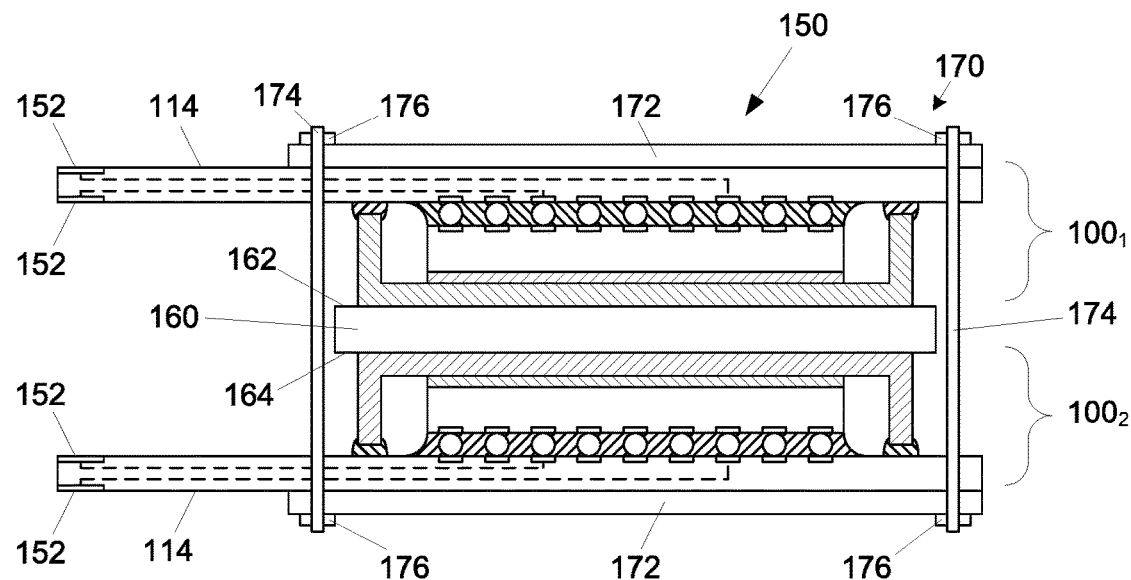
FIG. 3 is a side cross-section view of the intermediate integrated circuit assembly of FIG. 2 further including a securing mechanism, according to one embodiment of the present description.

As shown in FIG. 3, a securing mechanism 170 may be formed to secure the first integrated circuit package $100_1$ to the second integrated circuit package $100_2$. In one embodiment, the securing mechanism 170 may include a backing plate 172 on the second surface 114 of the electronic substrate 110 of each of the first integrated circuit package 1001 and the second integrated circuit package $100_2$, wherein the backing plates 172 may be connected together with at least one rod 174, such as a threaded rod, extending through the backing plates 172, the electronic substrate 110 of the first integrated circuit package $100_1$, and the electronic substrate 110 of the second integrated circuit package $100_2$. Each of the rods 174 may be secured in place with a retainer 176, such as a nut, adjacent to each backing plate 172.

Figure 4:
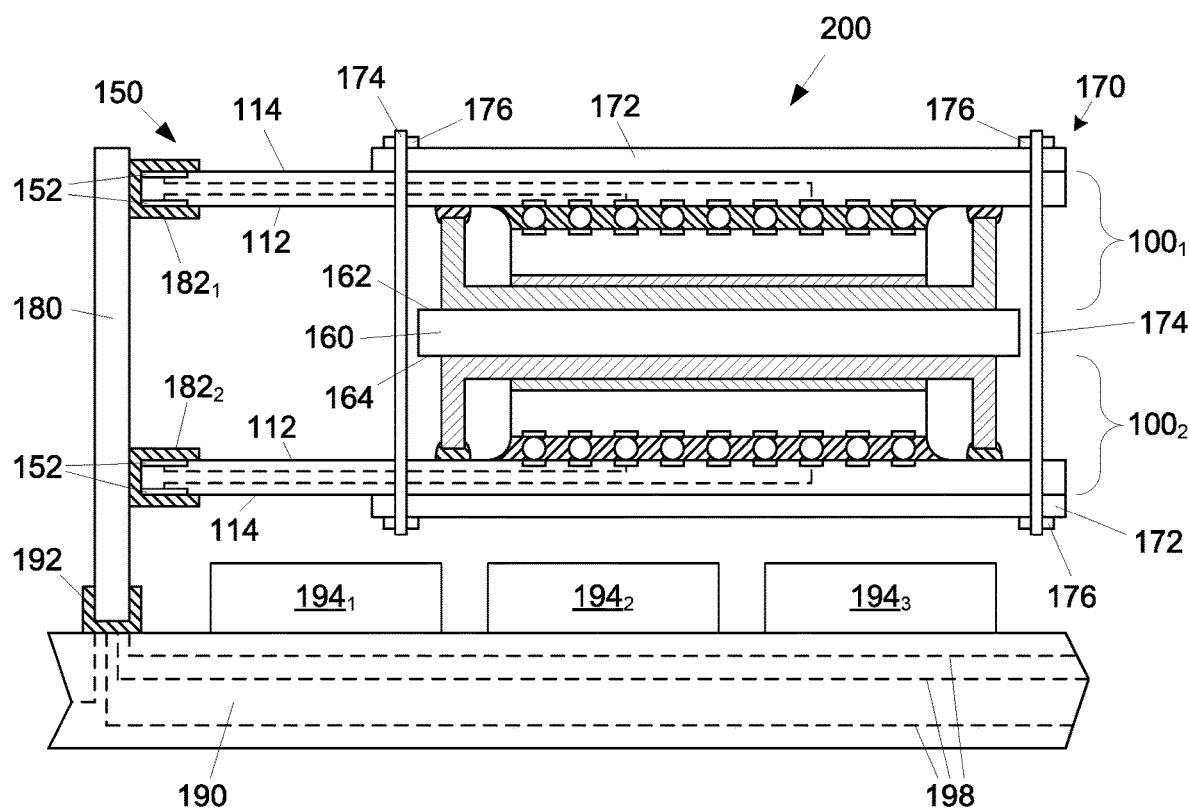
FIG. 4 is a side cross-sectional view of an integrated circuit assembly including the intermediate integrated circuit assembly of FIG. 3 electrically attached to an electronic board, according to one embodiment of the present description.

As shown in FIG. 4, the intermediate integrated circuit assembly 150 of FIG. 3 may be electrically attached to an electronic board 190 to form an integrated circuit assembly 200, according to one embodiment of the present description. As illustrated, the electronic substrate 110 of the first integrated circuit package $100_1$ and the electronic substrate 110 of the second integrated circuit package $100_2$ may be connected to the electronic board 190 through an electronic card 180. The electronic card 180 may include a plurality of connectors, wherein a first connector $182_1$ receives a portion of the electronic substrate 110 of the first integrated circuit package $100_1$ to make electrical contact with the edge connects 152 thereof, and wherein a second connector $182_2$ receives a portion of the electronic substrate 110 of the second integrated circuit package $100_2$ to make electrical contact with the edge connects 152 thereof. The electronic board 190 may include at least one connector 192, wherein the connector 192 receives a portion of the electronic card 180 to make electrical contact therewith. As will be understood, not only may the electronic card 180 facilitate the electrical transfer of signals between the first integrated circuit package $100_1$ and the electronic board 190, and between the second integrated circuit package $100_2$ and the electronic board 190, but may also facilitate the electrical transfer of signals between the first integrated circuit package $100_1$ and the second integrated circuit package $100_2$.

Both the electronic card 180 and the electronic board 190 may comprise a structure similar to that of the electronic substrate 110 of FIG. 1 and may comprise a plurality of dielectric material layers (not shown in FIG. 4), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, as well as laminates or multiple layers thereof, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The conductive routes (not shown) for the electronic card 180 and the conductive routes 198 of the electronic board 190 may be a combination of conductive traces (not shown) and conductive vias (not shown) that extend through the plurality of dielectric material layers (not shown). These conductive traces and conductive vias, and processes of forming the same, are well known in the art and are not shown in FIG. 4 for purposes of clarity. The conductive traces and the conductive vias may be made of any appropriate conductive material, including but not limited to, metals, such as copper, silver, nickel, gold, and aluminum, alloys thereof, and the like. As will be understood by those skilled in the art, the electronic card 180 and/or the electronic board 190 may be a cored substrate or a coreless substrate. As further shown in FIG. 4, additional integrated circuit devices, such as a first additional integrated circuit device $194_1$, a second additional integrated circuit device $194_2$, and a third additional integrated circuit device $194_3$, may be electrically attached to the electronic board 190.

Figure 5:
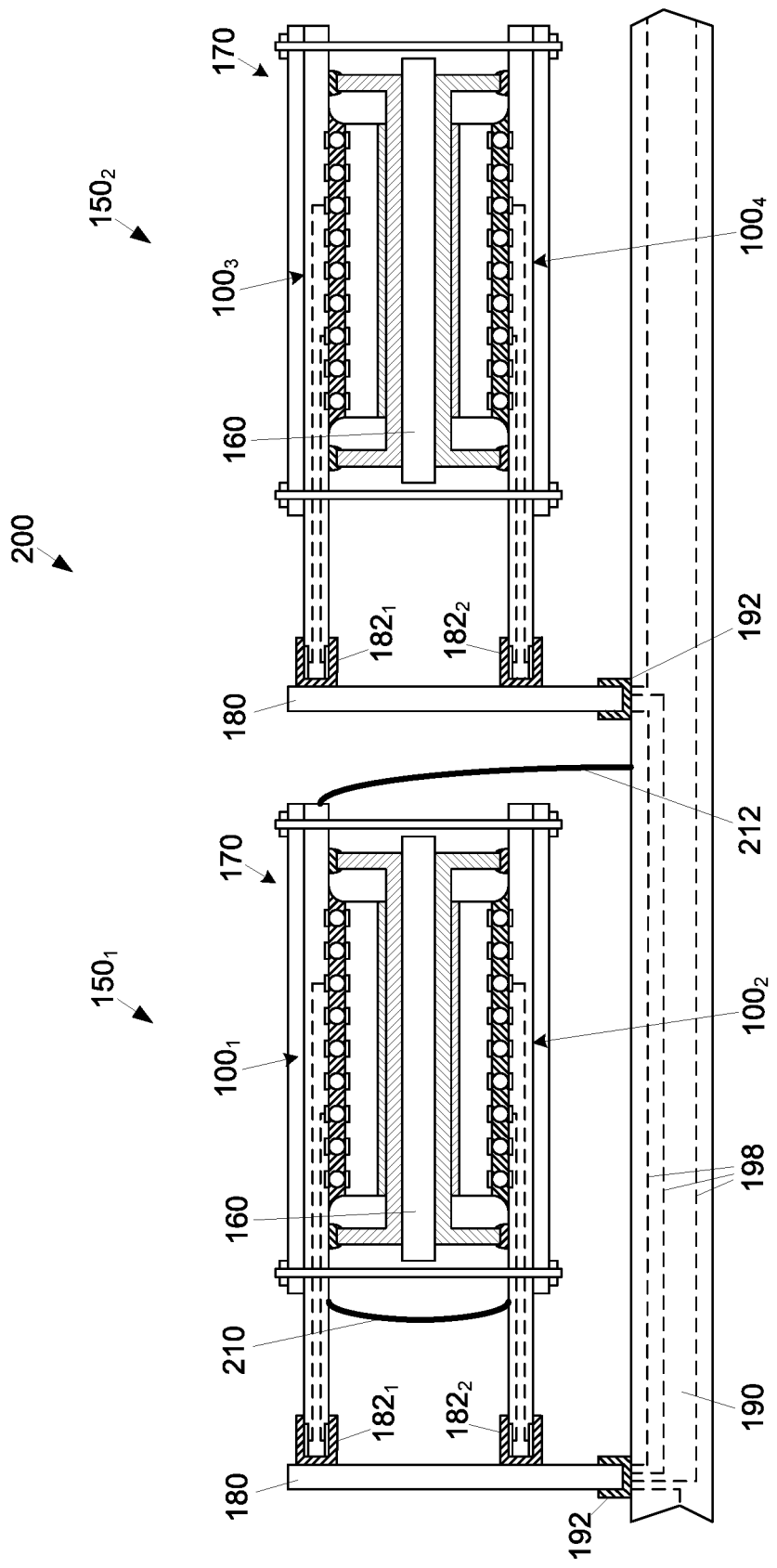
FIG. 5 is a side cross-sectional view of an integrated circuit assembly including a plurality of intermediate integrated circuit assemblies electrically attached to an electronic board, according to one embodiment of the present description.

The embodiments of the present description are not limited to the integrated circuit assembly 200 having the single intermediate integrated circuit assembly 150 attached to the electronic board 190, as shown in FIG. 4, but may include multiple intermediate integrated circuit assemblies, such as a first intermediate integrated circuit assembly $150_1$ having a first integrated circuit package $100_1$ and a second integrated circuit package $100_2$, and a second intermediate integrated circuit assembly $150_2$, having a first integrated circuit package $100_3$ and a second integrated circuit package $100_4$, as shown in FIG. 5. In one embodiment, the electrical connection between the electronic board 190 and the intermediate assemblies, as well as between integrated circuit package within the intermediate assemblies, need not be entirely through the electronic card 180. As shown in FIG. 5, a first cable 210, such as a flex cable or a ribbon cable, may extend between the first integrated circuit package 1001 and the second integrated circuit package $100_2$, and a second cable 212 may extend between the electronic board 190 and the first intermediate integrated circuit assembly 1501 (shown as attached to the first integrated circuit package $100_1$). Such cables, e.g. first cable 210 and second cable 212, may be useful in delivering power. For example, the first integrated circuit package $100_1$ may be a voltage regulator, and the second integrated circuit package $100_2$ may be a microprocessor. The second cable 212 may deliver a power voltage from the electronic board 190 to the first integrated circuit package $100_1$ and the first cable 210 may deliver a regulated voltage to the second integrated circuit package $100_2$.

Figure 6:
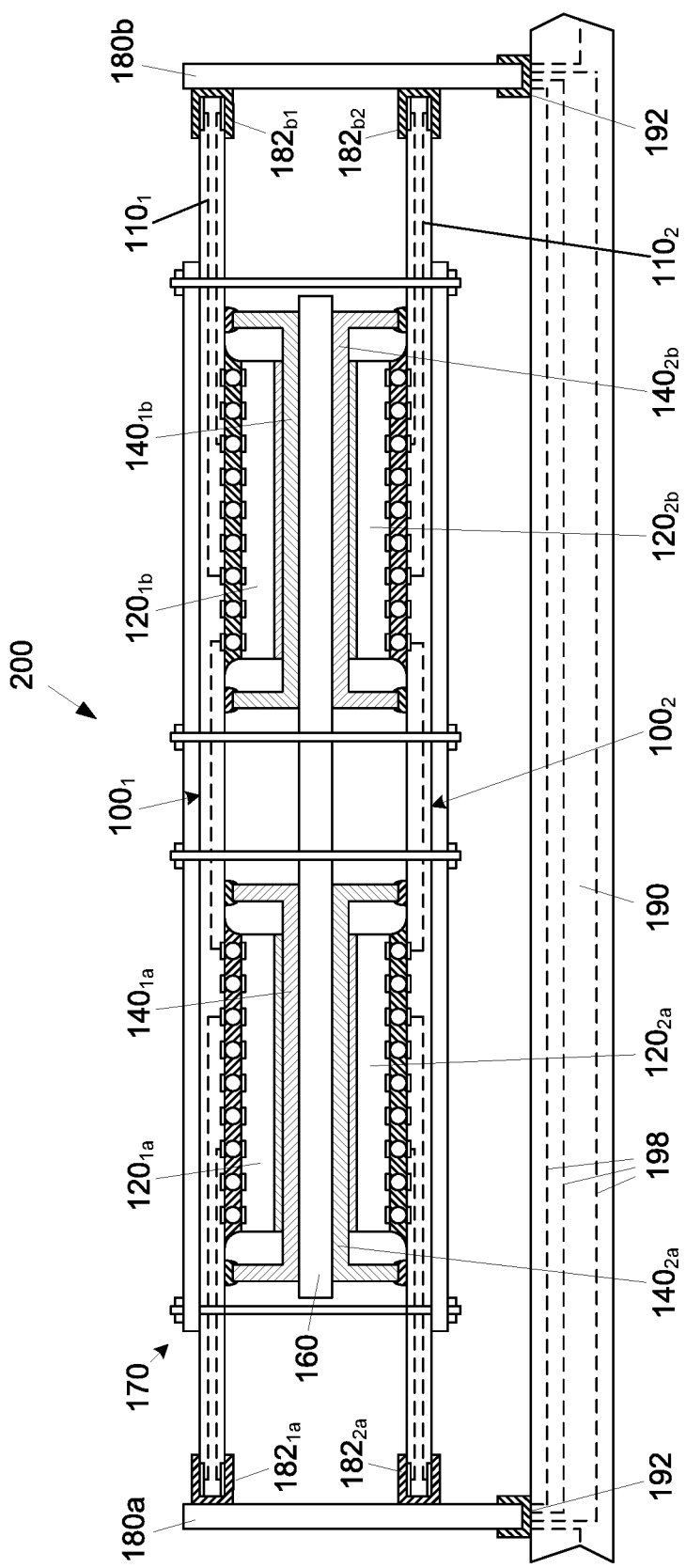
FIG. 6 is a side cross-sectional view of an integrated circuit assembly including two intermediate integrated circuit assemblies electrically attached to an electronic board, wherein the two intermediate integrated circuit assemblies share a single heat dissipation device, according to one embodiment of the present description.

In a further embodiment, as shown in FIG. 6, more than one integrated circuit device and one heat spreader may be attached to a single substrate to form an integrated circuit package. As shown, the first integrated circuit package $100_1$ may comprises a first integrated circuit device $120_{1a}$ and a second integrated circuit device $120_{1b}$ electrically attached to an electronic substrate $110_1$, with associated heat spreaders $140_{1a}$ and $140_{1b}$, respectively. The second integrated circuit package $100_2$ may comprises a first integrated circuit device $120_{2a}$ and a second integrated circuit device $120_{2b}$ electrically attached to an electronic substrate $110_2$ with associated heat spreaders $140_{2a}$ and $140_{2b}$, respectively. In one embodiment, the integrated circuit assembly 200 may include more than a single electronic card. As shown in FIG. 6, the integrated circuit assembly 200 may include multiple electronic cards, shown as first electronic card 180a and second electronic card 180b, to electrically connect the electronic substrates $110_1$ and $110_2$ together and with the electronic board 190.

Figure 7:
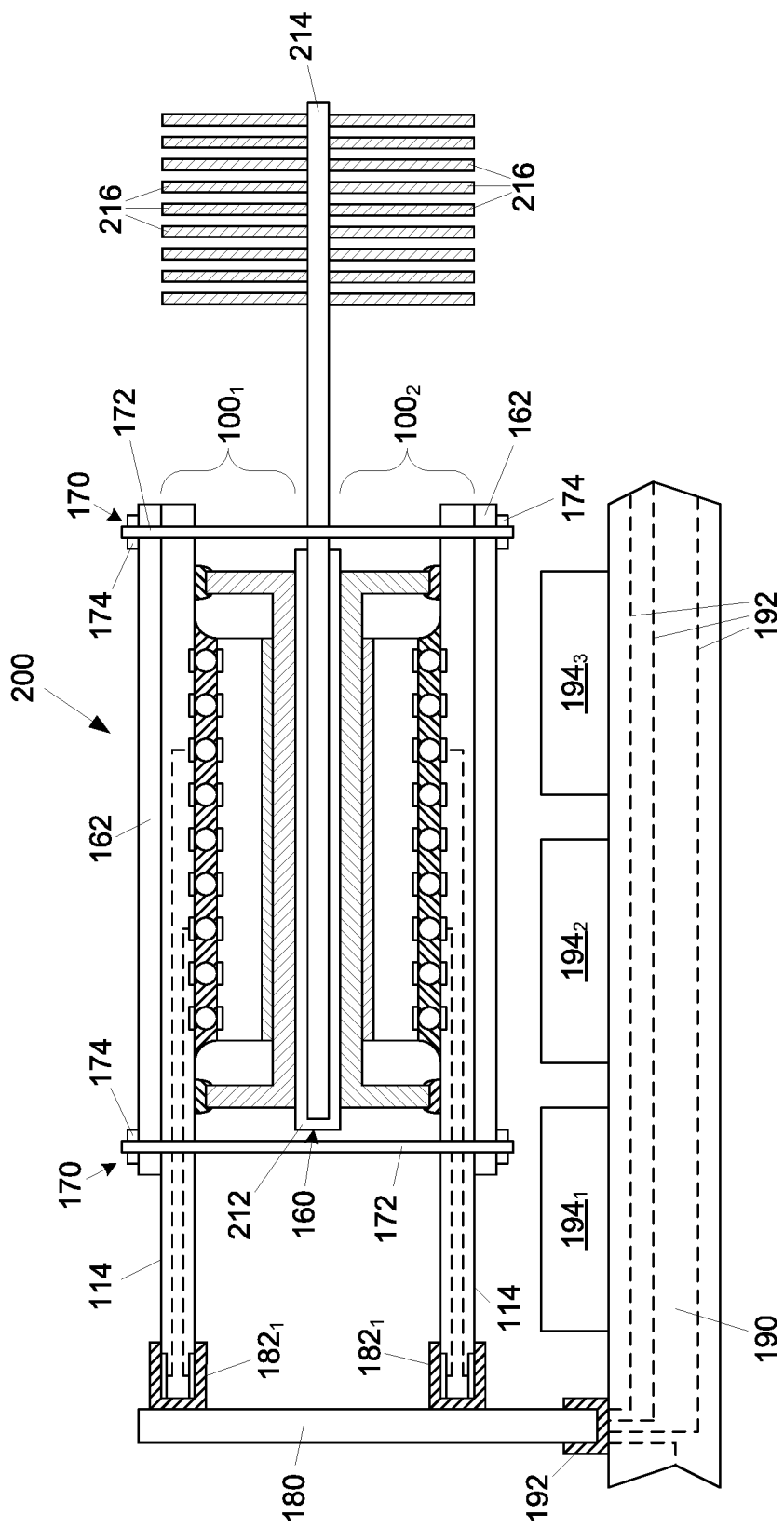
FIG. 7 is a side cross-sectional view of an integrated circuit assembly including an intermediate integrated circuit assembly electrically attached to an electronic board, wherein the intermediate integrated circuit assembly includes a heat dissipation device comprising a heat pipe, according to one embodiment of the present description.

In one embodiment of the present description, as shown in FIG. 7, the heat dissipation device 160 may be a heat pipe assembly comprising at least one heat pipe 214 held in a housing 212, wherein the housing 212 is positioned between the first integrated circuit package $100_1$ and the second integrated circuit package $100_2$. The heat dissipation device 160 may further include high surface area projections 216 to facilitate heat dispersion from the heat pipe 214.

Figure 8:
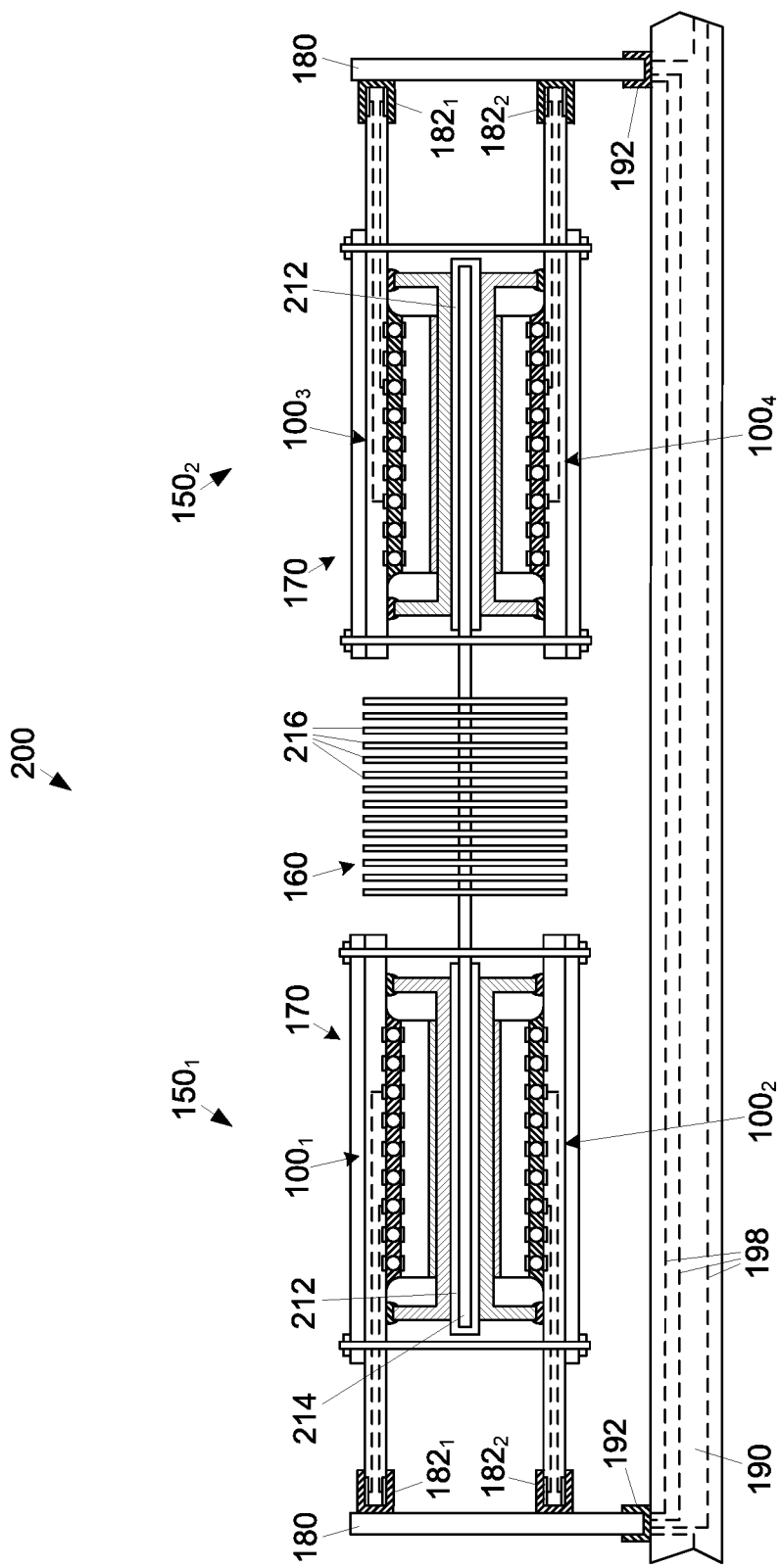
FIG. 8 is a side cross-sectional view of an integrated circuit assembly wherein the heat dissipation device of FIG. 7 is shared between two intermediate integrated circuit assemblies, according to one embodiment of the present description.

In a further embodiment of the present description, as shown in FIG. 8, at least two intermediate integrated circuit assemblies, shown as the first intermediate integrated circuit assembly $150_1$ and the second intermediate integrated circuit assembly $150_2$, may be electrically attached to the electronic board 190, such shown in FIG. 5. In this embodiment, the first intermediate integrated circuit assembly $150_1$ and the second intermediate integrated circuit assembly $150_2$ may be oriented to share at least one heat pipe 214. As illustrated, the at least one heat pipe 214 may extend between the heat pipe housing 212 of the first integrated circuit assembly $150_1$ and the heat pipe housing 212 of the second integrated circuit assembly $150_2$. The high surface area projections 216 may be positioned on the at least one heat pipe 214 between the first intermediate integrated circuit assembly $150_1$ and the second intermediate integrated circuit assembly $150_2$.

Figure 9:
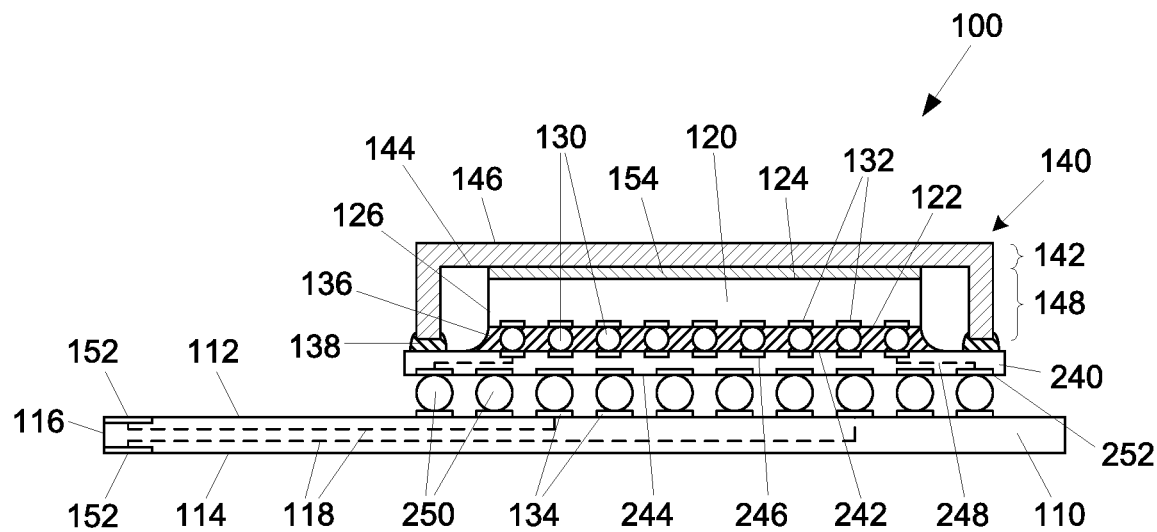
FIGS. 9 and 10 are side cross-sectional views of alternate integrated circuit packages, according to one embodiment of the present description.

It is understood that the integrated circuit package 100 may have any appropriate configuration. As shown in FIG. 9, the integrated circuit package 100 may further include an interposer 240, wherein the at least one integrated circuit device 120 may be attached to a first surface 242 of the interposer 240 with the plurality of device interconnects 130. The plurality of device interconnects 130 may extend between the bond pads 132 formed in or on a first surface 122 of the integrated circuit device 120, and substantially mirror-image bond pads 246 formed in or on the first surface 242 of the interposer 240.

As further shown in FIG. 9, the interposer 240 may provide electrical communication through conductive routes 248 (illustrated as dashed lines) between the at least one integrated circuit device 120 and bond pads on or in the second surface 244 of the interposer 240. The interposer 240 may be constructed in the manner previously discussed with regard to the electronic substrate 110. The interposer 240 may be attached to the first surface 112 of the electronic substrate 110 with the plurality of interposer interconnects 250. The plurality of interposer interconnects 250 may extend between the bond pads 252 formed in or on the second surface 242 of the interposer 240, and the bond pads 134 formed in or on the first surface 112 of the electronic substrate 110.

Figure 10:
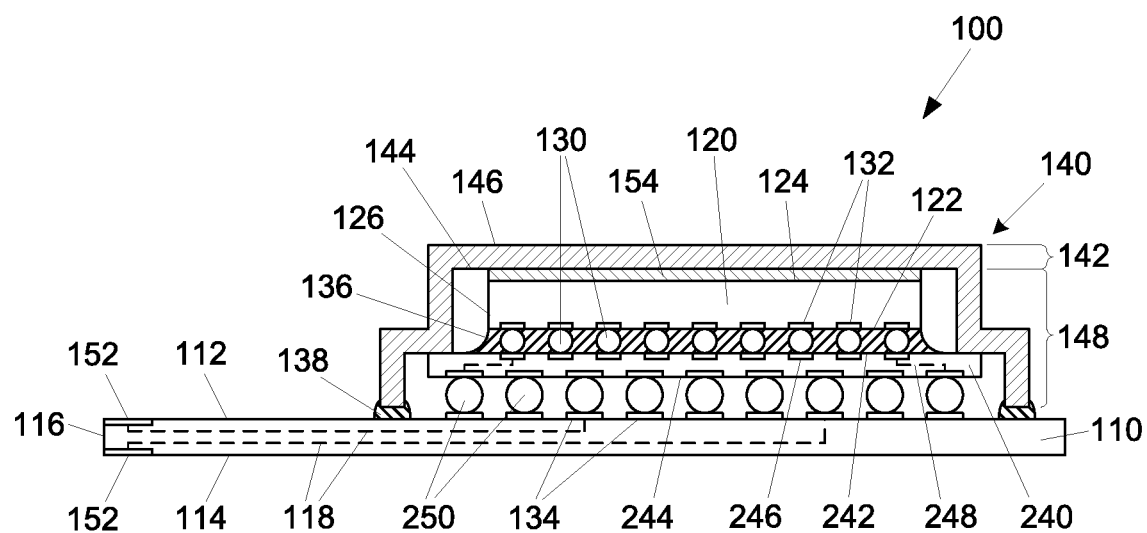

As shown in FIG. 10, the configuration of FIG. 9 may have the heat spreader 140 being attached to the first surface 112 of the electronic substrate 110. In one embodiment of the present description, the heat spreader 140 may contact the interposer 240.

Figure 11:
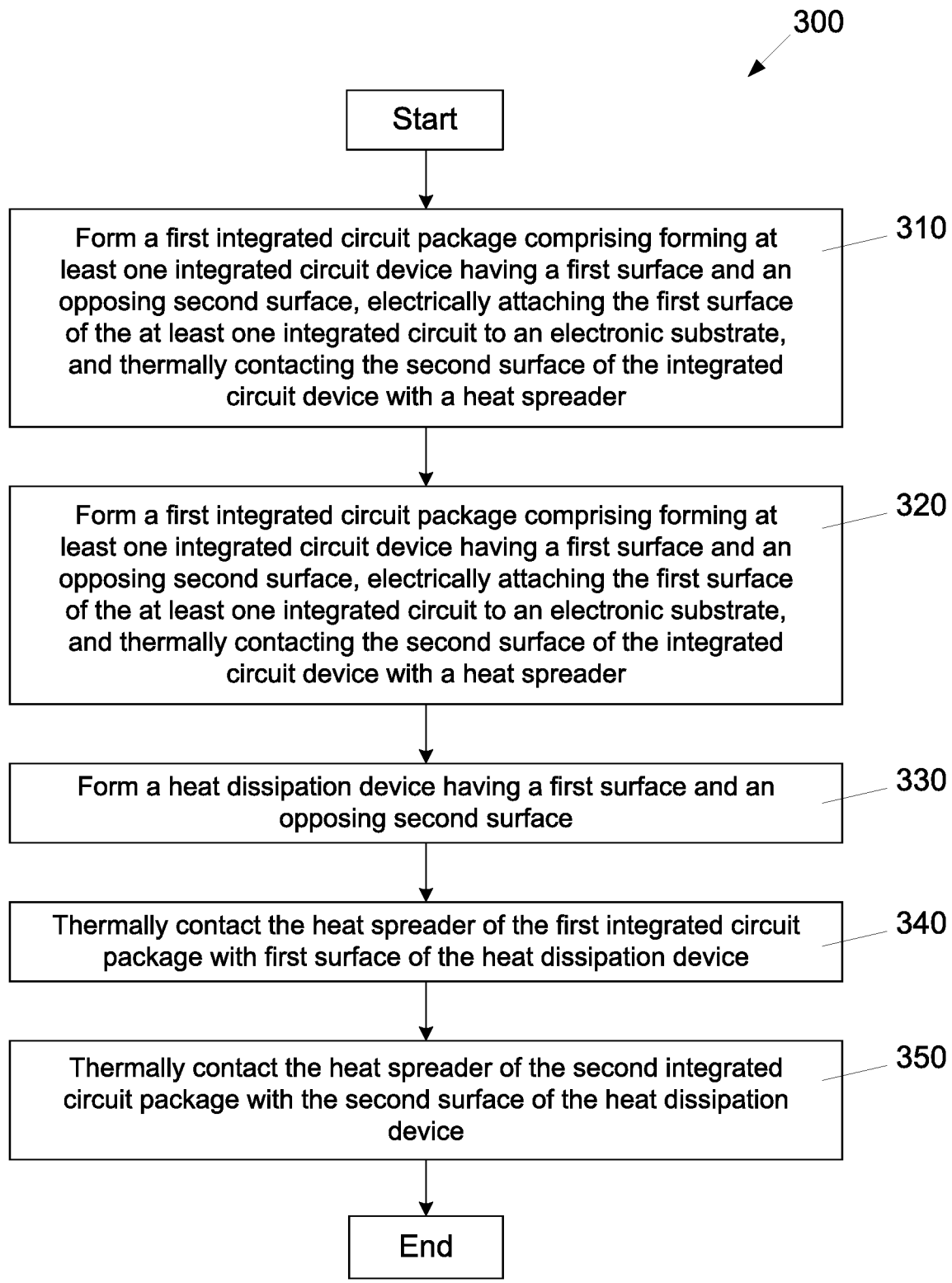
FIG. 11 is a flow chart of a process of fabricating an integrated circuit assembly, according to an embodiment of the present description.

FIG. 11 is a flow chart of a process 300 of fabricating an integrated circuit assembly according to an embodiment of the present description. As set forth in block 310, a first integrated circuit package may be formed comprising forming at least one integrated circuit device having a first surface and an opposing second surface, electrically attaching the first surface of the at least one integrated circuit device to an electronic substrate, and thermally contacting the second surface of the integrated circuit device with a heat spreader. A second integrated circuit package may be formed comprising forming at least one integrated circuit device having a first surface and an opposing second surface, electrically attaching the first surface of the at least one integrated circuit device to an electronic substrate, and thermally contacting the second surface of the integrated circuit device with a heat spreader, as set forth in block 320. As set forth in block 330, a heat dissipation device may be formed having a first surface and an opposing second surface. The heat spreader of the first integrated circuit package may be thermally contacted with the first surface of the heat dissipation device, as set forth in block 340. As set forth in block 350, the heat spreader of the second integrated circuit package may be thermally contacted with the second surface of the heat dissipation device.

Figure 12:
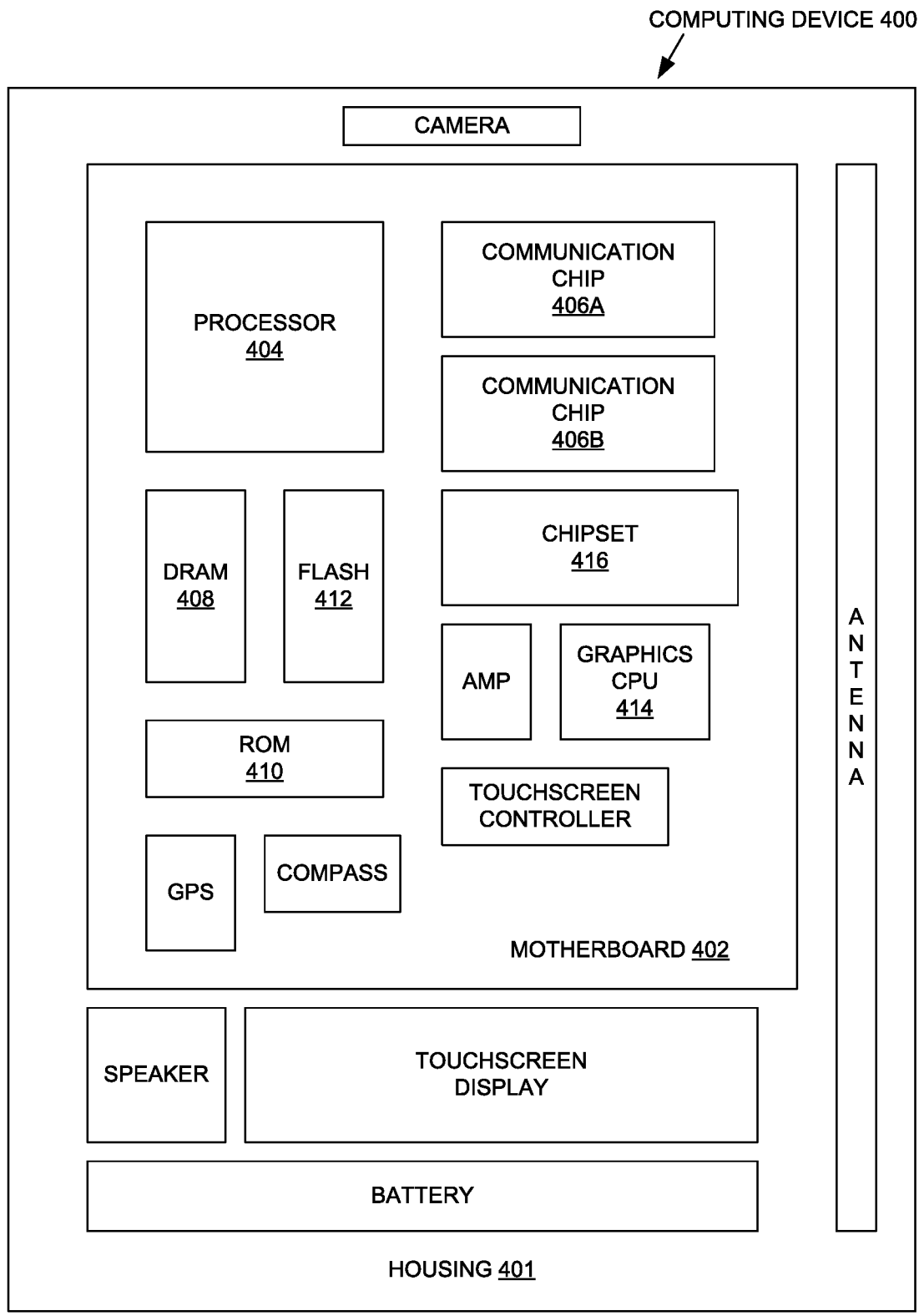
FIG. 12 is an electronic system, according to one embodiment of the present description.

FIG. 12 illustrates an electronic or computing device 400 in accordance with one implementation of the present description. The computing device 400 may include a housing 401 having a board 402 disposed therein. The computing device 400 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly comprising at least two integrated circuit packages, wherein the at least two integrated circuit packages share a heat dissipation device.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-12. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an integrated circuit assembly, comprising a first integrated circuit package comprising at least one integrated circuit device having a first surface and an opposing second surface, wherein the first surface of the at least one integrated circuit device is electrically attached to an electronic substrate, and wherein the second surface of the integrated circuit device thermally contacts a heat spreader; a second integrated circuit assembly comprising at least one integrated circuit device having a first surface and an opposing second surface, wherein the first surface of the at least one integrated circuit device is electrically attached to an electronic substrate, and wherein the second surface of the integrated circuit device thermally contacts a heat spreader; and a heat dissipation device having a first surface and an opposing second surface, wherein the heat spreader of the first integrated circuit package is in thermal contact with the first surface of the heat dissipation device and wherein the heat spreader of the second integrated circuit package is in thermal contact with the second surface of the heat dissipation device.

In Example 2, the subject matter of Example 1 can optionally include the heat spreader of the first integrated circuit package abutting the first surface of the heat dissipation device and the heat spreader of the second integrated circuit package abutting the second surface of the heat dissipation device.

In Example 3, the subject matter of any of Example 1 to 2 can optionally include the heat dissipation device comprising a liquid cooling device.

In Example 4, the subject matter of any of Example 1 to 3 can optionally include a first electronic card, wherein the electronic substrate of the first integrated circuit package and the electronic substrate of the second integrated circuit package are electrically attached to the first electronic card.

In Example 5, the subject matter of Example 4 can optionally include an electronic board, wherein the first electronic card is electrically attached to the electronic board.

In Example 6, the subject matter of Example 4 can optionally include a second electronic card, wherein the electronic substrate of the first integrated circuit package and the electronic substrate of the second integrated circuit package are electrically attached to the second electronic card.

In Example 7, the subject matter of Example 6 can optionally include an electronic board, wherein the first electronic card is electrically attached to the electronic board and wherein the second electronic card is electrically attached to the electronic board.

In Example 8, the subject matter of Examples 1 to 7 can optionally include the heat spreader of the first integrated circuit package being attached to the electronic substrate of the first integrated circuit package.

In Example 9, the subject matter of Examples 1 to 8 can optionally include the heat spreader of the second integrated circuit package being attached to the electronic substrate of the second integrated circuit package.

Example 10 is an electronic system, comprising a board and an integrated circuit assembly electrically attached to the board, wherein the integrated circuit assembly comprises a first integrated circuit package comprising at least one integrated circuit device having a first surface and an opposing second surface, wherein the first surface of the at least one integrated circuit device is electrically attached to an electronic substrate, and wherein the second surface of the integrated circuit device thermally contacts a heat spreader; a second integrated circuit assembly comprising at least one integrated circuit device having a first surface and an opposing second surface, wherein the first surface of the at least one integrated circuit device is electrically attached to an electronic substrate, and wherein the second surface of the integrated circuit device thermally contacts a heat spreader; and a heat dissipation device having a first surface and an opposing second surface, wherein the heat spreader of the first integrated circuit package is in thermal contact with the first surface of the heat dissipation device and wherein the heat spreader of the second integrated circuit package is in thermal contact with the second surface of the heat dissipation device.

In Example 11, the subject matter of Example 10 can optionally include the heat spreader of the first integrated circuit package abutting the first surface of the heat dissipation device and the heat spreader of the second integrated circuit package abutting the second surface of the heat dissipation device.

In Example 12, the subject matter of any of Example 10 to 11 can optionally include the heat dissipation device comprising a liquid cooling device.

In Example 13, the subject matter of any of Example 10 to 12 can optionally include a first electronic card, wherein the electronic substrate of the first integrated circuit package and the electronic substrate of the second integrated circuit package are electrically attached to the first electronic card.

In Example 14, the subject matter of Example 4 can optionally include an electronic board, wherein the first electronic card is electrically attached to the electronic board.

In Example 15, the subject matter of Example 13 can optionally include a second electronic card, wherein the electronic substrate of the first integrated circuit package and the electronic substrate of the second integrated circuit package are electrically attached to the second electronic card.

In Example 16, the subject matter of Example 15 can optionally include an electronic board, wherein the first electronic card is electrically attached to the electronic board and wherein the second electronic card is electrically attached to the electronic board.

In Example 17, the subject matter of Examples 10 to 16 can optionally include the heat spreader of the first integrated circuit package being attached to the electronic substrate of the first integrated circuit package.

In Example 18, the subject matter of Examples 10 to 17 can optionally include the heat spreader of the second integrated circuit package being attached to the electronic substrate of the second integrated circuit package.

Example 19 is a method of fabrication an integrated circuit assembly comprising forming a first integrated circuit package comprising forming at least one integrated circuit device having a first surface and an opposing second surface, electrically attaching the first surface of the at least one integrated circuit device to an electronic substrate, and thermally contacting the second surface of the integrated circuit device with a heat spreader; forming a second integrated circuit assembly comprising forming at least one integrated circuit device having a first surface and an opposing second surface, electrically attaching the first surface of the at least one integrated circuit device to an electronic substrate, and thermally contacting the second surface of the integrated circuit device with a heat spreader; forming a heat dissipation device having a first surface and an opposing second surface; thermally contacting the heat spreader of the first integrated circuit package with the first surface of the heat dissipation device; and thermally contacting the heat spreader of the second integrated circuit package with the second surface of the heat dissipation device.

In Example 20, the subject matter of Example 19 can optionally include abutting the heat spreader of the first integrated circuit package with the first surface of the heat dissipation device.

In Example 21, the subject matter of any of Example 19 to 20 can optionally include abutting the heat spreader of the first integrated circuit package with the first surface of the heat dissipation device. and abutting the heat spreader of the second integrated circuit package with the second surface of the heat dissipation device.

In Example 22, the subject matter of any of Example 19 to 21 can optionally include the heat dissipation device comprising a liquid cooling device.

In Example 23, the subject matter of any of Example 19 to 22 can optionally include forming a first electronic card, wherein the electronic substrate of the first integrated circuit package and the electronic substrate of the second integrated circuit package are electrically attached to the first electronic card.

In Example 24, the subject matter of any of Examples 19 to 23 can optionally include forming an electronic board, wherein the first electronic card is electrically attached to the electronic board.

In Example 25, the subject matter of any of Examples 4 can optionally include forming a second electronic card, and electrically attaching the electronic substrate of the first integrated circuit package and the electronic substrate of the second integrated circuit package to the second electronic card.

In Example 26, the subject matter of Example 25 can optionally include forming an electronic board, electrically attaching the first electronic card to the electronic board, and electrically the second electronic card to the electronic board.

In Example 27, the subject matter of Examples 19 to 26 can optionally include attaching the heat spreader of the first integrated circuit package to the electronic substrate of the first integrated circuit package.

In Example 28, the subject matter of Examples 19 to 27 can optionally include attaching the heat spreader of the second integrated circuit package to the electronic substrate of the second integrated circuit package.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit (IC) assembly, comprising first, second, third, and fourth IC packages each comprising an IC device, an electronic substrate, and a heat spreader, wherein a first surface of the IC device is electrically attached to the electronic substrate, and an opposing second surface of the IC device thermally contacts the heat spreader;
    a liquid cooling heat dissipation device having a first surface and an opposing second surface, wherein the heat spreaders of the first and third IC packages are in thermal contact with the first surface of the liquid cooling heat dissipation device and wherein the heat spreaders of the second and fourth IC packages are in thermal contact with the second surface of the liquid cooling heat dissipation device;
    a first securing mechanism comprising first and second plates, wherein the first IC package, the second IC package, and a first portion of the liquid cooling heat dissipation device are between the first and second plates of the first securing mechanism; and
    a second securing mechanism comprising first and second plates, wherein the third IC package, the fourth IC package, and a second portion of the liquid cooling heat dissipation device are between the first and second plates of the second securing mechanism, and wherein high surface area projections of the liquid cooling heat dissipation device are between the first and third IC packages and between the second and fourth IC packages.

2. The integrated circuit assembly of claim 1, wherein the liquid cooling heat dissipation device comprises a cold plate in thermal contact with the heat spreader of the first and second IC packages, and wherein the cold plate comprises a fluid chamber therein.

3. The integrated circuit assembly of claim 1, wherein the liquid cooling heat dissipation device comprises a heat pipe.

4. The integrated circuit assembly of claim 1, wherein the first and second plates of the first securing mechanism are connected by one or more first rods, and wherein the first and second plates of the second securing mechanism are connected by one or more second rods.

5. The integrated circuit assembly of claim 4, further comprising:
an electronic card, wherein the electronic substrate of the first IC package and the electronic substrate of the second IC package are electrically attached to the electronic card; and
an electronic board, wherein the electronic card is electrically attached to the electronic board.

6. The integrated circuit assembly of claim 5, further comprising:
a second electronic card, wherein the electronic substrate of the third IC package and the electronic substrate of the fourth IC package are electrically attached to the second electronic card, and wherein the second electronic card is electrically attached to the electronic board.

7. An electronic system, comprising:
an integrated circuit (IC) assembly electrically attached to a board, wherein the integrated circuit assembly comprises:
first, second, third, and fourth IC packages each comprising an IC device, an electronic substrate, and a heat spreader, wherein a first surface of the IC device is electrically attached to the electronic substrate, and an opposing second surface of the IC device thermally contacts the heat spreader;
a liquid cooling heat dissipation device having a first surface and an opposing second surface, wherein the heat spreaders of the first and third IC packages are in thermal contact with the first surface of the liquid cooling heat dissipation device and wherein the heat spreaders of the second and fourth IC packages are in thermal contact with the second surface of the liquid cooling heat dissipation device;
a first securing mechanism comprising first and second plates, wherein the first IC package, the second IC package, and a first portion of the liquid cooling heat dissipation device are between the first and second plates of the first securing mechanism; and
a second securing mechanism comprising first and second plates, wherein the third IC package, the fourth IC package, and a second portion of the liquid cooling heat dissipation device are between the first and second plates of the second securing mechanism, and wherein high surface area projections of the liquid cooling heat dissipation device are between the first and third IC packages and between the second and fourth IC packages.

8. The electronic system of claim 7, wherein the liquid cooling heat dissipation device comprises a cold plate in thermal contact with the heat spreader of the first and second IC packages, and wherein the cold plate comprises a fluid chamber therein.

9. The electronic system of claim 7, wherein the liquid cooling heat dissipation device comprises a heat pipe.

10. The electronic system of claim 7, wherein the first and second plates of the first securing mechanism are connected by one or more first rods, and wherein the first and second plates of the second securing mechanism are connected by one or more second rods.

11. The electronic system of claim 10, further comprising:
an electronic card, wherein the electronic substrate of the first IC package and the electronic substrate of the second IC package are electrically attached to the electronic card, and wherein the electronic card is electrically attached to the board.

12. The electronic system of claim 11, further comprising:
a second electronic card, wherein the electronic substrate of the third IC package and the electronic substrate of the fourth IC package are electrically attached to the second electronic card, and wherein the second electronic card is electrically attached to the board.

13. A method for fabricating an integrated circuit assembly, comprising:
forming first, second, third, and fourth IC packages each comprising an IC device, an electronic substrate, and a heat spreader, wherein a first surface of the IC device is attached to the electronic substrate, and an opposing second surface of the IC device thermally contacts the heat spreader;
receiving a liquid cooling heat dissipation device having a first surface and an opposing second surface;
thermally contacting the heat spreader of the first and third IC packages with the first surface of the liquid cooling heat dissipation device and thermally contacting the heat spreader of the second and fourth IC integrated circuit packages with the second surface of the liquid cooling heat dissipation device;
providing a first securing mechanism comprising first and second plates, wherein the first IC package, the second IC package, and a first portion of the liquid cooling heat dissipation device are between the first and second plates of the first securing mechanism;
providing a second securing mechanism comprising first and second plates, wherein the third IC package, the fourth IC package, and a second portion of the liquid cooling heat dissipation device are between the first and second plates of the second securing mechanism, and wherein high surface area projections of the liquid cooling heat dissipation device are between the first and third IC packages and between the second and fourth IC packages.

14. The method of claim 13, wherein the liquid cooling heat dissipation device comprises a cold plate in thermal contact with the heat spreader of the first and second IC packages, and wherein the cold plate comprises a fluid chamber therein.

15. The method of claim 13, wherein the liquid cooling heat dissipation device comprises a heat pipe.

16. The method of claim 13, wherein the first and second plates of the first securing mechanism are connected by one or more first rods, and wherein the first and second plates of the second securing mechanism are connected by one or more second rods.

17. The method of claim 16, further comprising:
providing an electronic card, wherein the electronic substrate of the first IC package and the electronic substrate of the second IC package are electrically attached to the electronic card; and
providing an electronic board, wherein the electronic card is electrically attached to the electronic board.

18. The method of claim 17, further comprising:
providing a second electronic card, wherein the electronic substrate of the third IC package and the electronic substrate of the fourth IC package are electrically attached to the second electronic card, and wherein the second electronic card is electrically attached to the electronic board.

* * * * *